(12) United States Patent
Mossoba et al.

(10) Patent No.: US 10,475,444 B1
(45) Date of Patent: *Nov. 12, 2019

(54) LISTENING DEVICES FOR OBTAINING METRICS FROM AMBIENT NOISE

(71) Applicant: Capital One Services, LLC, McLean, VA (US)

(72) Inventors: Michael Mossoba, Arlington, VA (US); Joshua Edwards, Philadelphia, PA (US); Abdelkadar M'Hamed Benkreira, Washington, DC (US); Austen Novis, Arlington, VA (US); Sophie Bermudez, Washington, DC (US)

(73) Assignee: Capital One Services, LLC, McLean, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/289,330

(22) Filed: Feb. 28, 2019

Related U.S. Application Data

(63) Continuation of application No. 16/005,277, filed on Jun. 11, 2018, now Pat. No. 10,249,293.

(51) Int. Cl.
| | |
|---|---|
| *G10L 15/00* | (2013.01) |
| *G10L 15/06* | (2013.01) |
| *G10L 21/16* | (2013.01) |
| *G10L 21/02* | (2013.01) |
| *G05B 19/042* | (2006.01) |
| *G01R 19/25* | (2006.01) |

(52) U.S. Cl.
CPC ........ *G10L 15/063* (2013.01); *G01R 19/2506* (2013.01); *G05B 19/042* (2013.01); *G10L 21/0202* (2013.01); *G10L 21/16* (2013.01); *G05B 2219/2639* (2013.01)

(58) Field of Classification Search
CPC ... G10L 15/22; G10L 15/32; G10L 2015/088; G10L 25/51; G10L 15/08; H04L 63/102
See application file for complete search history.

(56) References Cited

U.S. PATENT DOCUMENTS

| | | |
|---|---|---|
| 6,305,662 B1 | 10/2001 | Parsons et al. |
| 8,140,329 B2 | 3/2012 | Zhang et al. |
| 8,918,343 B2 | 12/2014 | Mitchell et al. |
| 9,219,928 B2 | 12/2015 | Shankar et al. |
| 9,247,273 B2 | 1/2016 | Shankar et al. |
| 9,286,911 B2 | 3/2016 | Mitchell et al. |

(Continued)

OTHER PUBLICATIONS

Sense, http://sense.com/product.html, May 22, 2018, 7 pages.

(Continued)

*Primary Examiner* — Edgar X Guerra-Erazo
(74) *Attorney, Agent, or Firm* — Harrity & Harrity, LLP

(57) ABSTRACT

A device may receive audio data based on a capturing of sounds associated with a structure. The device may obtain a model associated with the structure. The model may have been trained to receive the audio data as input, determine a score that identifies a likelihood that a sound is present in the audio data, and identify the sound based on the score. The device may determine at least one parameter associated with the sound. The device may generate a metric based on the at least one parameter associated with the sound, and perform an action based on the metric.

20 Claims, 9 Drawing Sheets

(56) References Cited

U.S. PATENT DOCUMENTS

| | | |
|---|---|---|
| 9,390,380 B2 | 7/2016 | Evans et al. |
| 9,886,954 B1 | 2/2018 | Meacham et al. |
| 10,249,293 B1* | 4/2019 | Mossoba ............... G10L 15/063 |
| 2001/0044719 A1 | 11/2001 | Casey et al. |
| 2011/0218952 A1 | 9/2011 | Mitchell et al. |
| 2012/0290230 A1 | 11/2012 | Berges et al. |
| 2014/0241533 A1 | 8/2014 | Gerrish et al. |
| 2014/0279744 A1 | 9/2014 | Evans et al. |
| 2014/0380349 A1 | 12/2014 | Shankar et al. |
| 2014/0380350 A1 | 12/2014 | Shankar et al. |
| 2015/0112678 A1 | 4/2015 | Binks et al. |
| 2016/0234595 A1 | 8/2016 | Goran et al. |
| 2016/0266594 A1 | 9/2016 | Kauffman et al. |
| 2016/0283967 A1 | 9/2016 | Mitchell et al. |
| 2016/0371604 A1 | 12/2016 | Evans et al. |
| 2017/0069339 A1* | 3/2017 | Braskich ................ G10L 25/51 |
| 2018/0284743 A1* | 10/2018 | Cella .................... G05B 23/024 |

OTHER PUBLICATIONS

Co-pending U.S. Appl. No. 16/005,277, entitled "Listening Devices for Obtaining Metrics From Ambient Noise", by Mossoba, Michael, filed Jun. 11, 2018, 65 pages.

\* cited by examiner

LISTENING DEVICES FOR OBTAINING METRICS FROM AMBIENT NOISE

RELATED APPLICATION

This application is a continuation of U.S. patent application Ser. No. 16/005,277, filed Jun. 11, 2018, which is incorporated herein by reference.

BACKGROUND

Smart speaker devices are available in the marketplace and perform various tasks based on voice recognition techniques, including, for example, facilitating music playback, making to-do lists, setting alarms, streaming podcasts, playing audiobooks, providing weather, traffic, sports, and/or other real-time information, to name a few. Smart speaker devices are activated by pressing a button and/or speaking a trigger phrase or a wake-word. A smart speaker device may engage a microphone for an active listening mode upon hearing the trigger phrase or the wake-word, so that the various tasks may be performed by the smart listening device based on the voice recognition techniques.

SUMMARY

According to some possible implementations, a method may include receiving, by a device, audio data based on a capturing of sounds associated with a structure. The method may include obtaining, by the device, a model associated with the structure. The model may have been trained to receive the audio data as input, determine a score that identifies a likelihood that a sound is present in the audio data, and identify the sound based on the score. The method may include determining, by the device, at least one parameter associated with the sound. The method may include generating, by the device, a metric based on the at least one parameter associated with the sound and performing, by the device, an action based on generating the metric.

According to some possible implementations, a device may include one or more memories, and one or more processors, communicatively coupled to the one or more memories. The one or more processors may be configured to receive audio data based on a capturing of sounds associated with a structure and obtain a model associated with the structure. The model may have been trained to receive the audio data as input, determine a score that identifies a likelihood that a sound is present in the audio data, and identify the sound based on the score. The one or more processors may be configured to determine at least one parameter associated with the sound and generate a metric based on the at least one parameter associated with the sound. The one or more processors may be configured to obtain cost data from a third-party device, determine a cost of consumption based on a correlation of the metric and the cost data, and perform an action based on determining the cost of consumption.

According to some possible implementations, a non-transitory computer-readable medium may store one or more instructions, that, when executed by one or more processors, cause the one or more processors to receive first audio data based on a first capturing of ambient noises associated with a first structure. The one or more instructions, when executed by the one or more processors, may cause the one or more processors to receive second audio data based on a second capturing of ambient noises associated with a second structure. The one or more instructions, when executed by the one or more processors, may cause the one or more processors to obtain a first model associated with the first structure. The first model may have been trained to receive the first audio data as input, determine a first score that identifies a likelihood that a first sound is present in the first audio data, and identify the first sound, from a first plurality of sounds included in the first audio data, based on the first score. The one or more instructions, when executed by the one or more processors, may cause the one or more processors to obtain a second model associated with the second structure. The second model may have been trained to receive the second audio data as input, determine a second score that identifies a likelihood that a second sound is present in the second audio data, and identify the second sound, from a second plurality of sounds included in the second audio data, based on the second score. The one or more instructions, when executed by the one or more processors, may cause the one or more processors to determine at least one first parameter associated with the first sound, determine at least one second parameter associated with the second sound, generate a first metric based on the first parameter associated with the first sound, and generate a second metric based on the second parameter associated with the second sound. The one or more instructions, when executed by the one or more processors, may cause the one or more processors to transmit the first metric to a first user equipment associated with the first structure to cause an action to be performed by the first user equipment, and transmit the second metric to a second user equipment associated with the second structure to cause an action to be performed by the second user equipment.

DETAILED DESCRIPTION

Figure 1A:
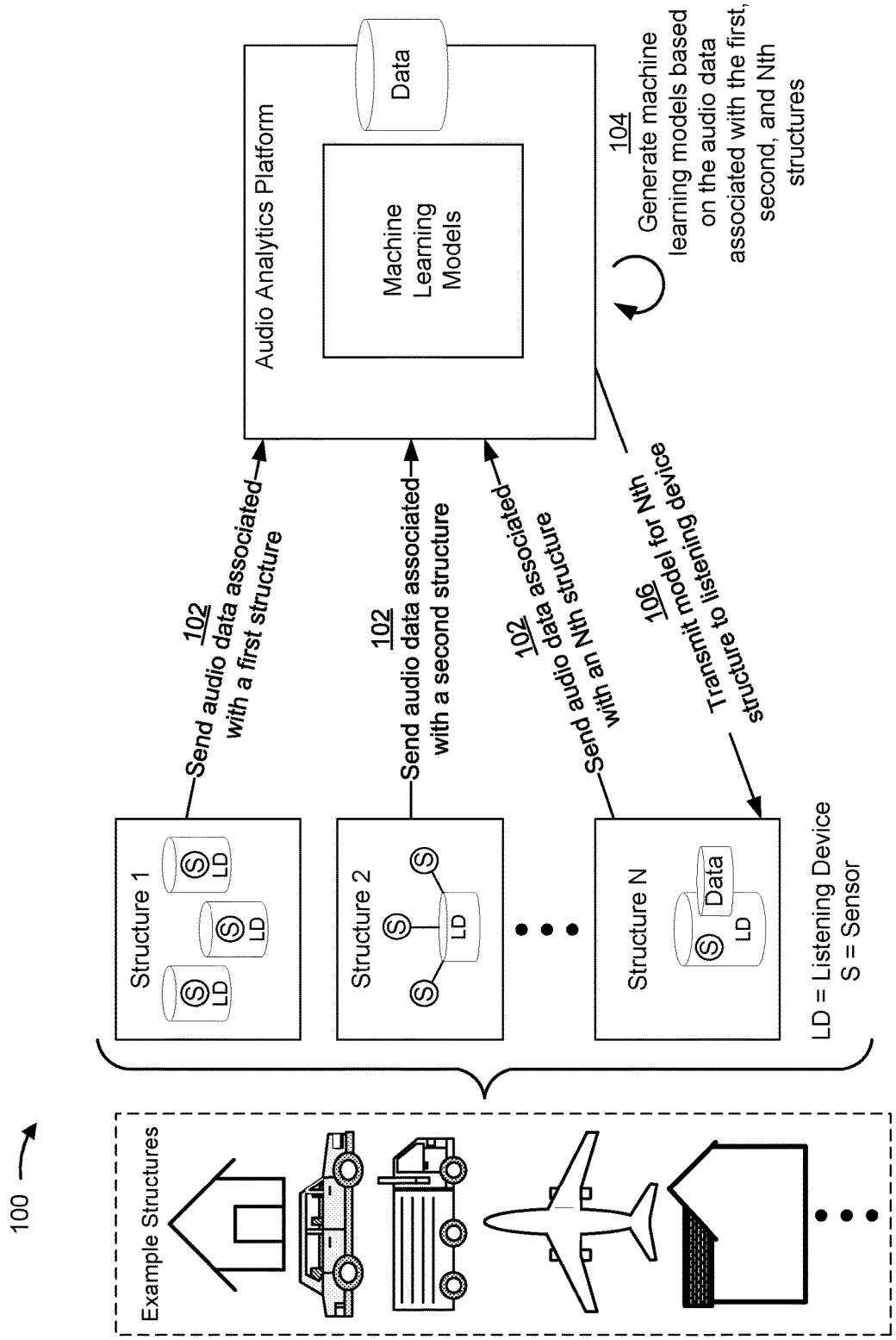
FIGS. 1A-1D are diagrams of an example implementation described herein.

The following detailed description of example implementations refers to the accompanying drawings. The same reference numbers in different drawings may identify the same or similar elements.

Smart speaker devices include an active listening component, which must be "woken" using a perceptible command or trigger. Such triggers include, for example, depressing a push button of the smart speaker device, interfacing with one or more interfaces of the smart speaker device, and/or speaking a verbal wake-word (e.g., "wake up, device") to the smart speaker device. Upon perceiving the trigger, the smart speaker device will engage the active listening component and begin actively listening for voice commands, by which the smart speaker device is instructed to perform tasks. The inherent limitations associated with having to wake the active listening component of the smart speaker devices, renders such devices incapable of performing actions or tasks based on a passive listening of ambient noises.

Sounds permeate the day-to-day lives and activities of a majority of human beings. Sounds that may be perceived as vague, ambient noises, and/or background noises to human beings, may, in actuality, be intelligently analyzed and used to derive metrics useful for any number of applications. For example, some implementations described herein include a listening device and/or an audio analytics platform, which may capture and/or receive audio data associated with a passive listening of a plurality of sounds, and intelligently identify at least one sound, from the plurality of sounds, using a model. The model may receive the audio data as input, and determine a score that identifies or predicts a likelihood that the at least one sound is present in the audio data.

In some implementations, the listening device and/or the audio analytics platform may determine a metric based on one or more parameters associated with the at least one sound identified as being present in the audio data. One or more tasks or actions may be performed based on determining the metric. For example, determining the metric may induce the performance of tasks or actions that improve or optimize energy consumption, improve or optimize commodity consumption, improve or optimize energy efficiencies, improve or optimize employment-related efficiencies, and/or the like. Whether it be the sound of a quick flip of a light switch, the soft hum of a heating, ventilation, and air conditioning (HVAC) unit running in the background, the removal of a paper towel from a dispenser, the flush of a toilet, the flow of water from a faucet, or air being circulated by way of a ceiling fan, some implementations described herein provide listening devices and/or audio analytics that leverage passive listening techniques and/or machine learning intelligence for determining metrics associated with energy usage, consumption, and/or efficiency for a structure.

In this way, resources that would otherwise be devoted to manually determining metrics associated with energy usage, consumption, and/or efficiency for the structure may be reduced or obviated. By implementing actions based on metrics associated with passively captured sounds, energy losses and/or waste may be controlled and/or minimized. In this way, audio data associated with multiple, simultaneously occurring sounds that may not be accurately perceived and/or analyzed by human actors may be used to derive meaningful metrics associated with energy usage, consumption, and/or efficiency. The listening devices and/or audio analytics platform described herein may capture, receive, and/or analyze thousands, millions, billions, or more instances of audio data, the volume of which cannot be processed objectively by human actors.

FIGS. 1A-1D are diagrams of an example implementation described herein. As shown in FIGS. 1A-1D, example implementation 100 may include one or more listening devices (i.e., designated "LD" in FIGS. 1A-1D, for illustration purposes only) associated with one or more structures, one or more sensor devices (i.e., designated "S" in FIGS. 1A-1D, for illustration purposes only) associated with the one or more structures, an audio analytics platform, one or more third-party devices, and/or user equipment, as described herein. The audio analytics platform may include one or more machine learning models and data (e.g., training data, captured and stored audio data, etc.), as described herein.

As shown in FIG. 1A, and by reference number 102, audio data may be sent, from a plurality of listening devices associated with a respective plurality of structures, to the audio analytics platform. In some implementations, one or more listening devices may be positioned in, on, and/or proximate to a structure for capturing the audio data associated with the structure. Example structures include a building (e.g., a house, an apartment building, an office building, a skyscraper, a restaurant, a retail building, etc.), a space formed by the building (e.g., a bedroom, a bathroom, an attic, a crawlspace, a particular office in the office building, a kitchen, a particular store in the retail building, etc.), a vehicle (e.g., a car, a truck, an airplane, a helicopter, a boat, etc.), a space formed by the vehicle (e.g., a driver side, a passenger side, a cargo area, a group or row of seats in an airplane, a cockpit, a deck, a cabin, etc.), and/or the like. Each structure may include a single listening device or multiple listening devices. Similarly, each listening device may be associated with a single sensor device or multiple sensor devices.

In some implementations, the one or more listening devices associated with a structure may include a standalone device that is configured to passively listen to and/or passively capture sounds using one or more sensor devices. The sensor devices may be locally disposed relative to the listening device (e.g., disposed inside of the listening device) or remotely disposed relative to the listening device (e.g., spaced apart from the listening device). The sensor device may include, for example, a sound sensor device. Example sound sensor devices include, without limitation, microphones, geophones, hydrophones, transducer-based sensor devices, pickups, and/or the like. The sensor devices may be connected to the listening device using wired or wireless connections. The sounds captured by the sensor devices may be obtained by a listening of sounds present in ambient noise and/or background noise associated with the structure. While sound sensor devices are described herein as capturing audio data, the audio analytics platform may, additionally or alternatively, obtain other, additional types of data for analyzing the audio data and/or generating metrics, such as, without limitation, vibration data, pressure data, temperature data, humidity data, image data, video data, and/or the like.

In some implementations, the one or more listening devices associated with a structure may include a user device (e.g., a phone, a computer, a tablet, a smart speaker device, etc.) that is configured to act as a listening device upon executing software instructions stored by a non-transitory computer-readable medium. For example, a user of a user device may execute an application stored on the user device to enable the user device to act as a listening device. The user device may be configured to receive audio data captured by one or more sensor devices (e.g., microphones, wireless sensor devices, etc.) associated with the structure, and transmit the audio data to the audio analytics platform.

In some implementations, the one or more listening devices associated with a structure may include a user interface. In some implementations, the one or more listening devices associated with the structure may be configured based on input or instructions received from a user, using a user interface, by which the user may access the listening device. For example, a user, using a user interface (i.e., an interface of the listening device and/or associated with the listening device), may specify, select, implement, and/or adjust one or more settings or instructions for operating the listening device. As an example, the user may select a schedule (e.g., using time-based settings) by which the listening device engages a sensor device to continuously capture audio data associated with the structure.

As another example, the user may select a time and/or a method of sending the audio data to the audio analytics platform. For example, the user may instruct the listening device to transmit the audio data to the audio analytics platform during periods of off-peak Internet usage and/or off-peak billing, such as during late night or early morning hours. In some implementations, the user may, using the user interface, instruct the listening device to transmit the audio data captured by the sensor devices to the audio analytics platform as a batch, as a stream (e.g., a real-time or a near real-time stream, etc.), and/or by exporting the audio data in a specified manner. Additionally, in some implementations, the user may, using the user interface, opt-in to sharing audio data with the audio analytics platform and/or opt-in to enabling the audio analytics platform to publish or share the audio data received from the listening device with a third-party. The user may opt-in to sharing anonymized audio data, in some implementations.

Additionally, in some implementations, the user, using the user interface, may specify or configure additional structure-specific data, information, and/or values that may assist the listening device and/or the audio analytics platform in determining metrics and/or tracking consumption. For instance, a user may specify or input a number of gallons per flush (gpf) for specific toilets associated with the structure, or the user may input an average value for all of the toilets in the structure. Alternatively, the user may opt-in to using an estimated, default value suggested or provided by the listening device and/or the audio analytics platform. As another example, the user may specify or input the size (i.e., the dimensions) of each door leading outside of the structure (e.g., a front door, a back door, a door leading into the garage, etc.), so that the listening device and/or the audio analytics platform may more accurately correlate and track losses of conditioned air each time a specific door is detected as being open based on the audio data. Further, the user may specify or input the wattage of specific lights within the structure or spaces formed by the structure, or the user may specify or input an average wattage of the lights in the structure to the spaces formed by the structure. In this way, the metrics may be more accurately determined based on structure-specific data, which may lead to further improvements in determining efficiency, preventing energy losses, optimizing energy usage, and/or eliminating waste.

As shown in FIG. 1A, a first structure may include multiple, different, and/or discrete, listening devices. The listening devices may be provided in different spaces formed by the first structure to passively listen to sounds associated with the first structure and/or the spaces formed by the first structure using sensor devices, and capture audio data associated with the sounds using the sensor devices. In some implementations, the listening devices may individually transmit the audio data to the audio analytics platform. Additionally, or alternatively, a first listening device of the plurality of listening devices may combine the audio data obtained by multiple listening devices and transmit combined audio data to the audio analytics platform. In some implementations, the listening devices included in the first structure may each include at least one sensor device that is locally disposed in and/or on the respective listening device.

As shown in FIG. 1A, a second structure may include at least one listening device configured to receive audio data captured by a plurality of sensor devices. For example, the listening device may receive audio data captured by discrete sensor devices that are spaced apart from the listening device. The sensor devices may be disposed in different spaces and/or locations of the second structure. For example, the sensor devices may be disposed in different rooms, sections, and/or portions of the second structure. In some implementations, the listening device in the second structure receives audio data captured by the plurality of sensor devices and transmits the audio data to the audio analytics platform for analysis.

As shown in FIG. 1A, a Nth structure (where N>2) may be associated with at least one listening device that includes a secure data storage element. The data stored in the data storage element may include a model, in some implementations. As described further below, the model may be used to identify one or more sounds present in the audio data. Additionally, as described further below, and, in some implementations, the audio analytics platform may train the model based on audio data received from the listening device associated with the Nth structure, and send the model to the listening device associated with Nth structure so that the listening device may analyze audio data captured by one or more sensor devices of the listening device.

In some implementations, the audio data transmitted by the listening devices, as indicated by reference number 102, may be used as training data for training at least one machine learning model associated with the respective structures. For example, in some implementations, the listening devices may implement an initial, optionally interactive training mode by which a user of a listening device may be instructed to perform actions to generate audio data, by which the audio analytics platform may train the machine learning model. As an example, the user of a listening device may be instructed to flush a toilet, flip a light switch, open a door, turn on a faucet, turn on a lamp, dispense paper towels from a paper towel dispenser, dispense toilet paper from a roll of toilet paper, fasten a seatbelt, and/or the like. The listening devices may capture the audio data associated with performing such tasks, and send the audio data to the audio analytics platform. The audio analytics platform may receive the audio data associated with performing the tasks and generate machine learning models based on extracting and/or correlating features associated with the audio data with sound identifiers. As described further below, in some implementations, the machine learning models may be trained to identify parameters associated with the audio data, and generate metrics based on the parameters.

In some implementations, the audio analytics platform trains the machine learning models for respective structures by sampling the audio data received from the listening devices associated with the respective structures, extracting features from the audio data, correlating the extracted features to sound identifiers, and identifying or classifying incoming sounds based on the correlated features. Example features associated with audio data, by which the audio analytics platform may train the machine learning models include, without limitation, time domain features (e.g., root-mean-square error (RSME) of the audio waveform), frequency domain features (e.g., amplitude of frequencies), perceptual features (e.g., mel-frequency cepstral coefficients), and/or the like.

Other methods of training and/or generating machine learning models for identifying sounds from audio data and determining metrics based on the sounds in the audio data are contemplated. For example, the machine learning models may be trained using training data contained in generic training data libraries, in some implementations. As another example, a machine learning model may be trained using at least some of the training data obtained from a first structure, and modify the training data obtained from the first structure using sounds learned from the second structure. In this way, an interactive training mode may be dispensed with, as a model based on a first structure can be automatically re-trained and re-fined over time, using data obtained from the second structure.

As further shown in FIG. 1A, as shown by reference number 104, the audio analytics platform may generate machine learning models based on the audio data received from the listening devices associated with the first, second, and Nth structures. The machine learning models may be used to identify sounds based on audio data received from listening devices, determine parameters associated with the identified sounds, and/or generate metrics based on the parameters, in some instances. In some implementations, the audio analytics platform may generate and store machine learning models for each of a plurality of structures, including, for example, the first structure, the second structure, and the Nth structure. In this way, the audio analytics platform may train, generate, and/or store hundreds, thousands, millions, or more machine learning models for a respective number of structures based on millions, billions, trillions, or more data points obtained from audio data received from hundreds, thousands, or more listening devices. In this way, resources devoted to manually analyzing audio data and/or deriving metrics from the audio data may be reduced or obviated.

In some implementations, the machine learning models used to analyze the audio data as described herein may be trained using training data that includes features extracted from training data as described above. The machine learning models may be trained to receive audio data as input, determine a score that identifies a likelihood that a sound is present in the audio data, and identify the sound based on the score. In some implementations, the score may be compared to a threshold value (e.g., a confidence level), by which the audio analytics platform may classify the sound and identify the sound based on associating the sound with a sound identifier where the threshold is satisfied.

As FIG. 1A illustrates, and by reference number 106, the audio analytics platform may optionally transmit a trained model associated with a structure to a listening device. The model may be stored in a secure storage element of the listening device. For example, the listening device associated with the Nth structure may receive a machine learning model from the audio analytics platform and store the machine learning model in the secure storage element. The machine learning model may be trained to identify sounds present in audio data associated with the Nth structure. In this way, the listening device may obtain audio data, and locally analyze the audio data to determine metrics, and/or perform actions based on the metrics as described herein. In this way, resources that would otherwise be needed to facilitate remote transmission of the audio data may be reduced or obviated.

Figure 1B:
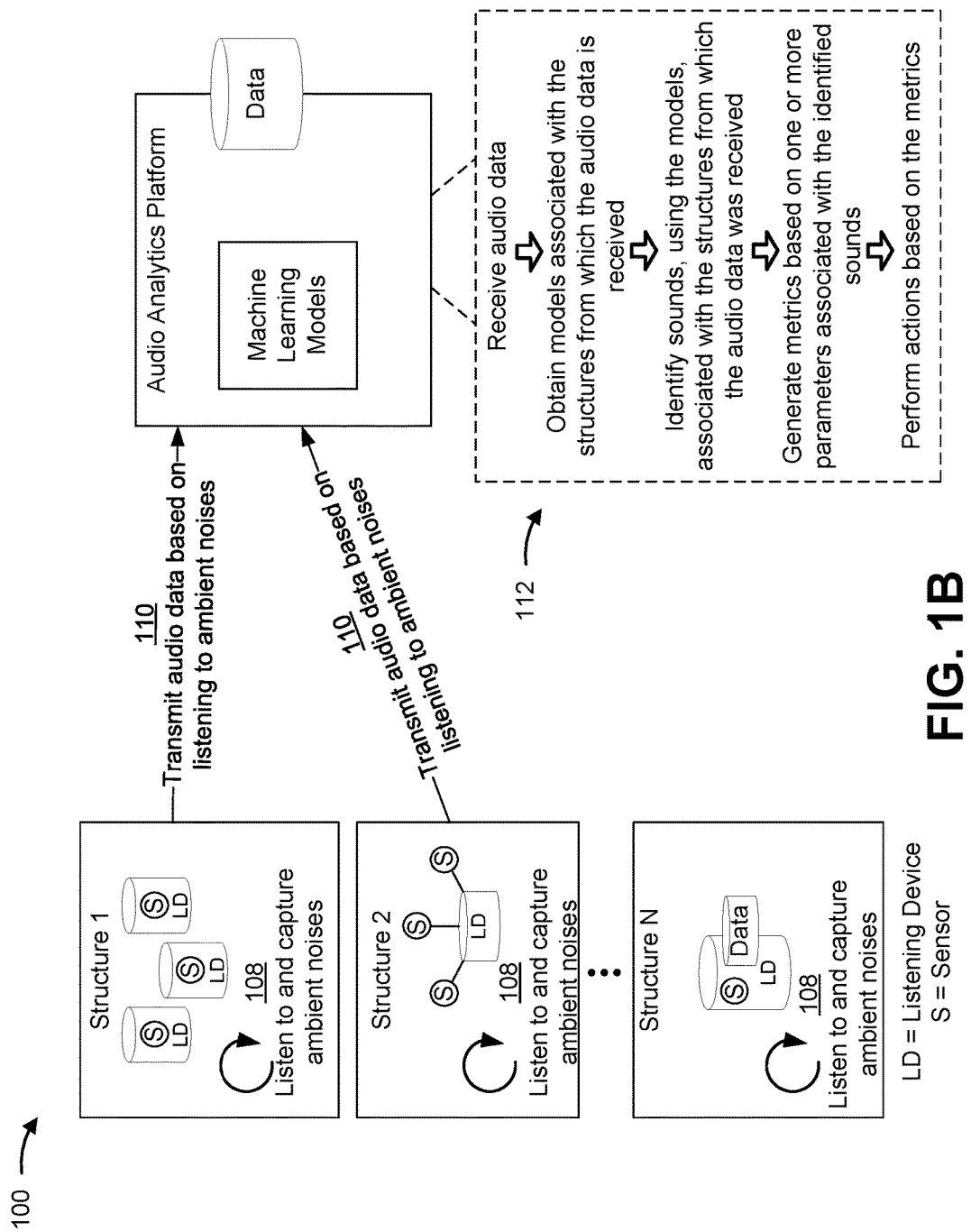

As shown in FIG. 1B, and by reference number 108, the listening devices associated with the structures may, for example, using the sensor devices, listen to ambient noises and capture audio data associated with the listening of ambient noises. In some implementations, the listening devices may obtain or capture audio data associated with an electrical device or system powering on or off (e.g., HVAC systems powering on or off, light switches powering lights or ceiling fans on or off, televisions being powered on or off, etc.). In some implementations, the listening devices may capture audio data associated with an increase or a decrease in the loudness (e.g., decibel level) of the ambient noises for determining the occurrence of an event. For example, an increase or decrease in the decibel level of the ambient noises associated with a structure may be used to determine a respective opening and closing of a door or a window.

In some implementations, the listening devices may capture data associated with sounds indicative of an occurrence of an event, consumption of a product, a commodity, and/or a good, a presence of a human being, and/or the like for use in determining metrics relating to efficiency and/or consumption. For example, the listening devices may listen for and capture audio data associated with a mechanical engagement of a seatbelt, audio data associated with an opening and/or closing of a refrigerator or freezer door, audio data associated with consumption of a paper product (e.g., a sound of paper towels being dispensed, a sound of toilet paper being dispensed, etc.), audio data associated with consumption of food (e.g., feeding a dog an amount of dog food), audio data associated with consumption of fuel (e.g., a vehicle engine increasing in revolutions per minute (RPM), etc.), audio data associated with a human voice to detect the presence of the human, audio data associated with a human typing on a keyboard of a computer to detect the presence of the human, and/or the like.

As shown in FIG. 1B, and by reference number 110, the listening devices may transmit the audio data associated with the listening of ambient noises to the audio analytics platform. For example, as FIG. 1B illustrates, the listening devices associated with the first and second structures may transmit the audio data captured by the listening devices to the audio analytics platform. As described herein, and, in some implementations, the audio data may be indicative of and/or associated with an electrical device or system powering on or off, the occurrence of an event, the consumption of a good, the presence of a human being, the consumption of fuel, the consumption of a utility, and/or the like. The audio data received at the audio analytics platform may be indicative of and/or associated with increases in a total noise level and/or decreases in the total noise level. The audio analytics platform may analyze the audio data and determine metrics based on analyzing the data.

In some implementations, the audio data received by the audio analytics platform may be associated with simultaneously captured and/or overlapping sounds. For example, the audio data received by the audio analytics platform may include audio data associated with at least a first sound that partially overlaps with audio data for a second sound. The audio analytics platform may be configured to detect the first and second sounds, for example, by applying a filter and/or a machine learning model to the audio data by which the sounds may be separately classified and analyzed. In this way, sounds that may not be perceived as separate or distinct by human actors may be analyzed and used to generate metrics.

As shown in FIG. 1B, and by reference number 112, the audio analytics platform may receive the audio data from the listening devices associated with the structure, obtain machine learning models associated with the structures from which the audio data was received, identify sounds present in the audio data using the machine learning models, generate metrics based on one or more parameters associated with the identified sounds, and perform actions based on the metrics.

In some implementations, the audio analytics platform may receive the audio data in a digital file format. The audio data may be uncompressed or compressed. The audio data may be received as a raw bitstream in an audio coding format, embedded in a container format, or embedded in an audio data format with a defined storage layer. In some implementations, the audio data includes timestamp information. The audio analytics platform may determine parameters associated with sounds identified in the audio data based on the timestamp information. For example, the audio analytics platform may determine a time at which an event occurred, a number of times an event occurred within a given time period, and/or an amount of time between events (e.g., between an HVAC unit turning on and turning off, etc.). In some implementations, the audio data may include a location identifier (e.g., a structure identifier). The audio analytics platform may determine parameters associated with sounds identified in the audio data based on the location identifier. For example, the audio analytics platform may determine that an event occurred in a bathroom, a bedroom, or a kitchen of a building based on the location identifier.

In some implementations, the audio analytics platform may obtain machine learning models associated with the structures from which the audio data was received. In some implementations, the models are trained based on the ambient noises common to a structure and configured to identify a particular sound or combination of sounds from all the ambient noises at the structure. For example, the audio analytics platform may obtain a first machine learning model associated with the first structure, a second machine learning model associated with the second structure, and a Nth machine learning model associated with the Nth structure. The audio analytics platform may obtain the machine learning models from a local storage element or a remote storage element of a cloud computing environment as described herein. In some implementations, and, as described above, a machine learning model associated with a structure may have been trained to receive, as input, audio data associated with the structure, determine a score that identifies a likelihood that a sound is present in the audio data, and identify the sound based on the score. In some implementations, the sound may be identified from a plurality of sounds contained in the audio data. In some implementations, the audio analytics platform may update, refine, correct, and/or retrain aspects of the machine learning model where the metrics being generated by the audio analytics platform appear to be incorrect. In this way, computing resources that would otherwise be wasted determining incorrect metrics may be conserved.

In some implementations, the audio analytics platform may determine at least one parameter associated with the sound identified as being present in the audio data, and generate metrics based on the parameter. The at least one parameter may include, for example, an amount of time associated with an occurrence of the sound, a count associated with an occurrence of the sound, and/or a decibel level associated with an occurrence of the sound. For example, the audio analytics platform may generate a metric by determining an aggregated amount of time associated with a plurality of occurrences of a sound during a specified time period (e.g., where the parameter includes an amount of time associated with an occurrence of the sound). In some implementations, the audio analytics platform may generate a metric by increasing a count by one for each occurrence of the sound during a specified time period (e.g., where the parameter includes a count associated with an occurrence of the sound). The at least one parameter may be determined based on timestamp information and/or location identifiers associated with the audio data, in some implementations.

As an example, the audio analytics platform may identify a sound in audio data and determine that the sound occurred twenty times during a specified time period. As a specific example, the audio analytics platform may receive audio data associated with a bathroom of a building, identify, using a machine learning model, a sound of a toilet flushing in the audio data, and determine that the toilet flushed twenty times in a 24-hour period. The audio analytics platform may generate the metric (i.e., the toilet being flushed a total of twenty times) based on the sound (i.e., the toilet flushing) and the parameter associated with the sound (i.e., the count). As described further herein, the audio analytics platform may perform an action based on determining the metric. For example, the audio analytics platform may access third-party data from one or more third-party devices to determine consumption and/or efficiency metrics based on correlating the third-party data and the count of the toilet flushing. As an example, a consumption metric may indicate a number of gallons of water consumed by flushing the toilet twenty times per day.

As another example, the audio analytics platform may receive audio data from a retail store, identify, using a machine learning model, an occurrence of predetermined increase in an ambient noise level followed by a predetermined decrease in the ambient noise level based on the audio data. The audio analytics platform may, using the machine learning model, associate the occurrence of the predetermined increase and decrease in the ambient noise level with a door being opened and closed in the retail store. The audio analytics platform may generate a metric identifying a total amount of time that the door was open based on aggregating the amounts of time between each occurrence of the door being opened and closed, and determine, for example, that the door was opened for a total of two-hours within a given 24-hour time period. The audio analytics platform may generate the metric (i.e., the door being opened for the total of two-hours during the 24-hour time period) based on the sound (i.e., the increase and decrease in ambient noise level) and the parameter associated with the sound (i.e., an amount of time between each occurrence of the increase and decrease in ambient noise level).

The metrics generated by the audio analytics platform may be useful in providing an initial assessment or indication of events occurring in association with a structure. As described below, the audio analytics platform may perform one or more actions based on determining the metrics for a structure. For example, the audio analytics platform may obtain third-party data from one or more third-party devices to further characterize the events occurring in association with the structure and generate additional metrics (e.g., consumption metrics), in some implementations. As an example, the audio analytics platform may correlate the door being open to an amount and/or cost of conditioned air being lost by way of the door being opened for two-hours within a 24-hour period.

As another example, the audio analytics platform may identify a sound of a seatbelt click closing a seatbelt in audio data associated with an airplane, and determine that the seatbelt click occurred eighteen times during a specified time period and/or within a specified location. The audio analytics platform may determine such information using, for example, timestamp information and/or a location identifier. As an example, the location identifier may identify a zone of the aircraft from which the audio data was received. The audio analytics platform may generate the metric (i.e., a total of eighteen seatbelt clicks occurring) based on the occurrence of the sound and the parameter associated with the sound (i.e., the count). As described further below, the audio analytics platform may perform an action based on the metric. As an example, in this case, the action may include notifying a member of a flight crew that eighteen seatbelt clicks were detected for a zone that includes twenty-four seats. The notification may further notify the member of the flight crew that six seatbelts are not detected as being closed, based on the metric. The member of the flight crew may be instructed to investigate which passengers need to buckle a seatbelt based on the metric.

Similarly, as another example, the audio analytics platform may identify a sound of a seatbelt opening in audio data associated with an airplane, and determine that twenty seatbelts were opened during a specified time period and/or within a specified location. The audio analytics platform may determine such information using, for example, timestamp information and/or a location identifier identifying a zone of the aircraft from which the audio data was received. The audio analytics platform may generate the metric (i.e., a total of twenty seatbelt openings occurring) based on the occurrence of the sound and the parameter associated with the sound (i.e., the count). As described further below, the audio analytics platform may perform an action based on the metric. As an example, in this case, the action may include notifying a member of a flight crew that twenty seatbelts openings were detected for a zone that includes twenty-four seats. The notification may further notify the member of the flight crew that four seatbelts remain closed, based on the metric. The member of the flight crew may be instructed to investigate which passengers may need assistance in unbuckling a seatbelt based on the metric.

Figure 1C:
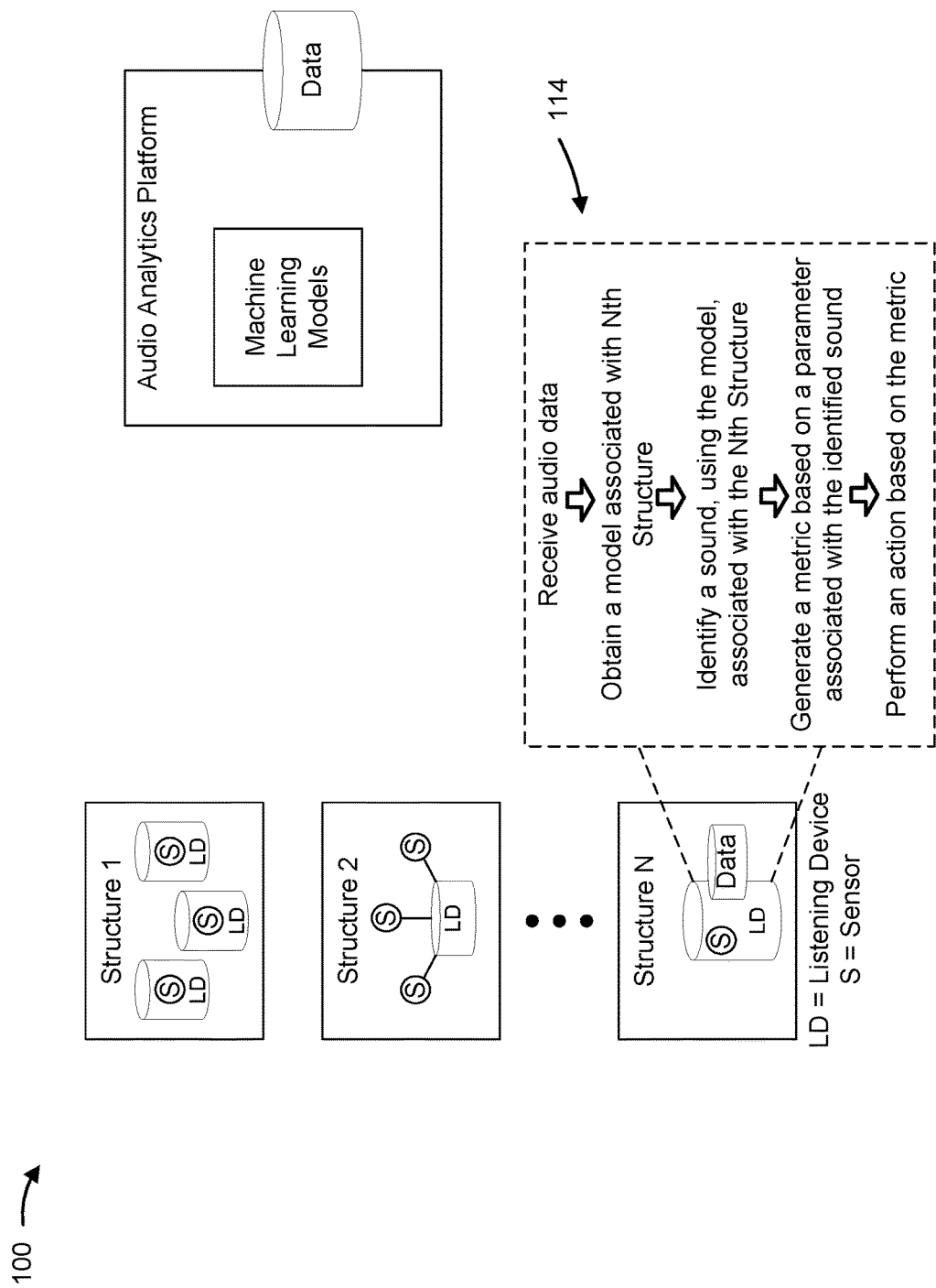

As shown in FIG. 1C, and by reference number 114, in some implementations a listening device may receive the audio data from the sensor devices associated with the structure, obtain a machine learning model stored in a secure data storage element of the listening device, identify sounds present in the audio data, using the machine learning model, generate metrics based on one or more parameters associated with the identified sounds, and perform actions based on the metrics. In this way, computing resources that would otherwise be spent facilitating transmission of audio data from the listening device to the audio analytics platform may be conserved. Additionally, in this implementation, determining metrics and performing actions based on the metrics may be realized more quickly, in some instances in real-time, or near-real time. Providing the machine learning model local to the listening device can obviate any delays associated with having to send data to the audio analytics platform, wait for the platform to analyze the data, and wait to receive an instruction from the platform.

In some implementations, the listening device associated with the Nth structure may receive the audio data from the sensor devices in a digital file format, which may be uncompressed or compressed. In some implementations, the audio data received by the listening device includes timestamp information associated with a time and/or duration associated with an occurrence of a sound and/or a location identifier associated with a space and/or spatial location of the occurrence of the sound within the structure. The location identifier may identify the space (e.g., a room, a side of a vehicle, a zone of an aircraft, a swimming pool area of a cruise ship, etc.) using an identifier and/or spatial coordinates that identify the location corresponding to where the sound occurred and/or where the audio data was captured. The listening device may determine parameters associated with a sound identified in the audio data based on the timestamp information and/or the location identifier, in some implementations.

In some implementations, the listening device may obtain the machine learning model associated with the Nth structure. The machine learning model associated with the Nth structure may have be trained to receive, as input, audio data associated with the Nth structure, determine a score that identifies a likelihood that a sound is present in the audio data, and identify the sound based on the score. In some implementations, the sound is identified from a plurality of sounds contained in the audio data. In some implementations, the listening device may update, refine, correct, and/or re-train aspects of the machine learning model where the metrics being generated by the listening device appear to be incorrect. In this way, computing resources that would otherwise be spent determining incorrect metrics may be conserved.

In some implementations, the listening device may determine at least one parameter associated with the sound identified as being present in the audio data, and generate metrics based on the parameter. As described above, at least one parameter may include, for example, an amount of time associated with an occurrence of the sound, a count associated with an occurrence of the sound, and/or a decibel level associated with an occurrence of the sound. For example, the listening device may generate a metric by determining an aggregated amount of time associated with a plurality of occurrences of a same sound during a specified time period (e.g., where the parameter includes an amount of time associated with an occurrence of the sound). In some implementations, the listening device may generate a metric by increasing a count by one for each occurrence of the sound during a specified time period (e.g., where the parameter includes a count associated with an occurrence of the sound). The at least one parameter may be determined based on timestamp information and/or location identifiers associated with the audio data, in some implementations.

As an example, the listening device may identify a sound of a paper product being dispensed (e.g., paper towels being dispensed, toilet paper being dispensed, etc.) in audio data associated with a bathroom, and determine that the dispensing of the paper product occurred fifty times during a specified time period and/or occurred for a total of twenty-five minutes during the specified time period. The listening device may determine such information using, for example, the timestamp information associated with the audio data. The listening device may generate the metrics (i.e., the total count of fifty times and the total duration of twenty-five minutes during the specified time period) based on the occurrence of the sound and the parameters associated with the sound. As described further below, the listening device may perform an action based on the metrics. As an example, in this case, the action may include accessing cost information associated with the paper product from a third-party device. The listening device may correlate the duration of the dispensing of the paper product to a cost for generating a usage or consumption metric.

Figure 1D:
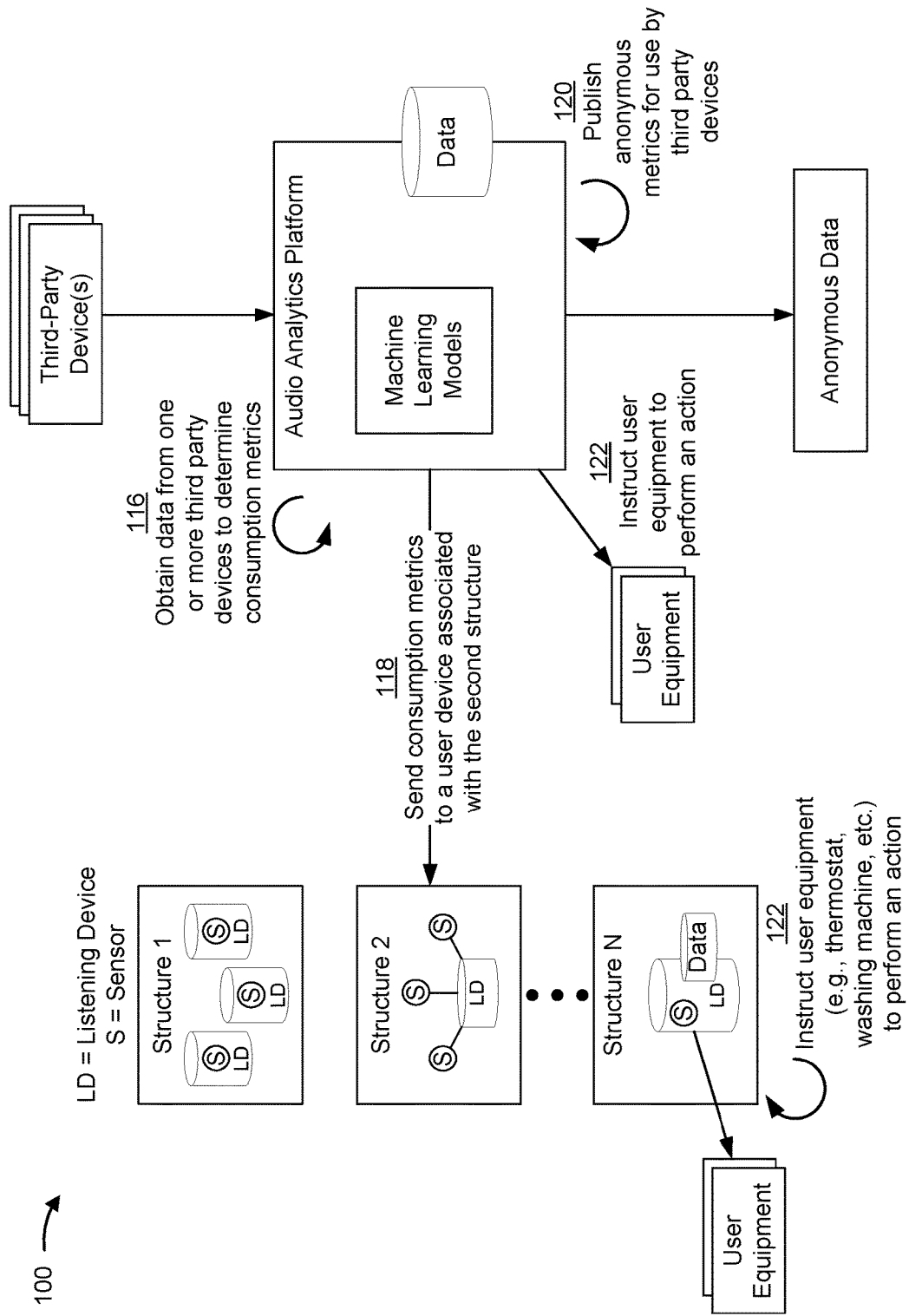

Referring now to FIG. 1D, and, in some implementations, the listening device and/or the audio analytics platform may perform actions based on determining metrics for a structure. Example actions include, for example, accessing third-party data to determine consumption or efficiency metrics, publishing the metrics, generating, and sending notifications to a user based on the metrics, instructing user equipment to perform an action based on the metrics, and/or the like.

For example, as shown in FIG. 1D, and by reference number 116, the audio analytics platform may perform an action of obtaining third-party data from one or more third-party devices to determine consumption metrics. The audio analytics platform may determine consumption metrics by correlating the metrics (i.e., determined at reference number 112) and the third-party data. In some implementations, the third-party devices may include a server, a computer, or a website hosted by the third-party, which provide cost-related data associated with obtaining access to a public utility, a good, or a service. The audio analytics platform may subscribe to receive the third-party data from the third-party devices. Additionally, or alternatively, the third-party devices may export or stream the third-party data to the audio analytics platform.

As an example, the third-party data may include a cost of consuming an amount of water during a specified time period, a cost of consuming an amount of consumable goods (e.g., paper products, raw materials, food, and/or the like) during the specified time period, a cost of consuming an amount of electrical power during the specified time period, a cost of consuming an amount of natural gas during a specified time period, or a cost of consuming an amount of conditioned air during the specified time period.

As an example, in some implementations, the audio analytics platform may determine one or more cost of consumption metrics based on the third-party data. The cost of consumption metrics may include a cost of consuming an amount of water during a specified time period, a cost of consuming an amount of consumable goods during the specified time period, a cost of consuming an amount of electrical power during the specified time period, a cost of consuming an amount of natural gas during a specified time period, a cost of consuming an amount of conditioned air during the specified time period, and/or the like. Similarly, the audio analytics platform may determine energy efficiency metrics, in some implementations, based on accessing third-party efficiency data (e.g., how many gallons a toilet uses per flush, how much conditioned air is lost from a certain sized door, etc.) determining how much energy is lost during the occurrence of an event. Additionally, or alternatively, the audio analytics platform may estimate efficiency metrics using estimated efficiency data (e.g., an estimate of the number of gallons a toilet uses, an estimate of how much conditioned air is lost from the door, etc.).

As shown in FIG. 1D, and by reference number 118, the audio analytics platform may perform an action of sending the consumption metrics to a user device associated with the second structure. The audio analytics platform may generate and send a notification to the user device for display by the user device. The notification may include the consumption metric. A user of the user device may perform additional actions based on receiving the notification. For example, the user of the user device may adjust a HVAC setting or schedule based on receiving the notification, adjust a water temperature setting based on receiving the notification, adjust a vehicle control based on receiving the notification, and/or the like. The user may receive the notification on a user device, which may include, without limitation, a computer (e.g., a laptop computer, a desktop computer, etc.), a tablet, a phone, a smart device, and/or the like. The notifications may be sent via an SMS text message, an MMS message, an electronic-mail message, a pop-up notification, and/or the like.

As shown in FIG. 1D, and by reference number 120, the audio analytics platform may publish one or more metrics generated by the audio analytics platform and/or a listening device for access and use by a querying device. For example, the audio analytics platform may publish the metrics generated based on the parameters associated with the identified sounds, the cost of consumption metrics, and/or the like for use by a querying device. In some implementations, the metrics are anonymized in advance of being published. In some implementations, anonymizing the metrics may include removing any data associated with the device that generated the metric, removing any data associated with the device that captured the audio data used to generate the metric, and/or the like. The querying device may access the published metrics using, for example, a web-call, an API call, and/or the like. As a specific example, the anonymized metrics may include an average amount of paper towels being consumed per public restroom in a specific geographic region. In this case, the querying device may include a device associated with a manufacturer of paper products. The manufacturer may use the metric in forecasting sales, targeting customers, and/or the like.

As shown in FIG. 1D, and by reference number 122, the listening device and/or the audio analytics platform may generate and send instructions to user equipment associated with the Nth structure based on the metrics. The user equipment may include, for example and without limitation, a smart thermostat, a smart washing machine, a smart dryer, a smart device, a smart appliance, a smart refrigerator, a smart freezer, a smart water heater, and/or the like. The instructions transmitted to the user equipment may instruct the user equipment to power on, power off, adjust a setting (e.g., a temperature setting, a time-based scheduling setting, etc.), increase power consumption, decrease power consumption, and/or the like. As an example, the listening device and/or the audio analytics platform may instruct a smart thermostat to increase a temperature within a structure, decrease a temperature within a structure, and/or the like. As another example, the listening device and/or the audio analytics platform may instruct a smart washing machine to use cold water, warm water, or hot water for a cycle.

In this way, a listening device and/or an audio analytics platform may determine metrics based on a passive capturing of sounds associated with a structure. The sounds may be captured continuously or according to a schedule. The metrics may cause or induce performance of actions that improve or optimize energy efficiency, improve or optimize consumption, and/or reduce waste. By intelligently identifying sounds associated with thousands, millions, billions, or more instances of audio data received from thousands, millions, or more listening devices, computing resources that would otherwise be needed to manually identify sounds associated with a structure and manually determine the metrics are conserved, reduced, and/or obviated.

Furthermore, the listening device and/or the audio analytics platform described herein may automate the generation and/or derivation of metrics based on audio data, and, thus, conserve resources that would otherwise be needed to manually generate such metrics. In this way, several different stages of the process for determining metrics may be automated, which may remove human subjectivity and waste from the process, and which may improve speed and/or efficiency of metric derivation and conserve computing resources (e.g., processor resources, memory resources, and/or the like).

Furthermore, implementations described herein use a rigorous, computerized process to perform tasks or roles that were not previously performed or were previously performed using subjective human intuition or input. For example, currently there does not exist a technique for automated derivation of energy usage, consumption, and/or efficiency metrics based on passively acquired audio data. Finally, automating the process for derivation of energy usage, consumption, and/or efficiency metrics as described herein conserves computing resources (e.g., processor resources, memory resources, and/or the like) that would otherwise be wasted in attempting to manually generate such metrics.

As indicated above, FIGS. 1A-1D are provided merely as an example. Other examples are possible and may differ from what was described with regard to FIGS. 1A-1D. Although various actions may be shown as being performed by either the listening device or the audio analytics platform, in actuality, any of the actions described herein may be performed by any of the listening device, the audio analytics platform, and/or a combination of the listening device and the audio analytics platform.

Figure 2:
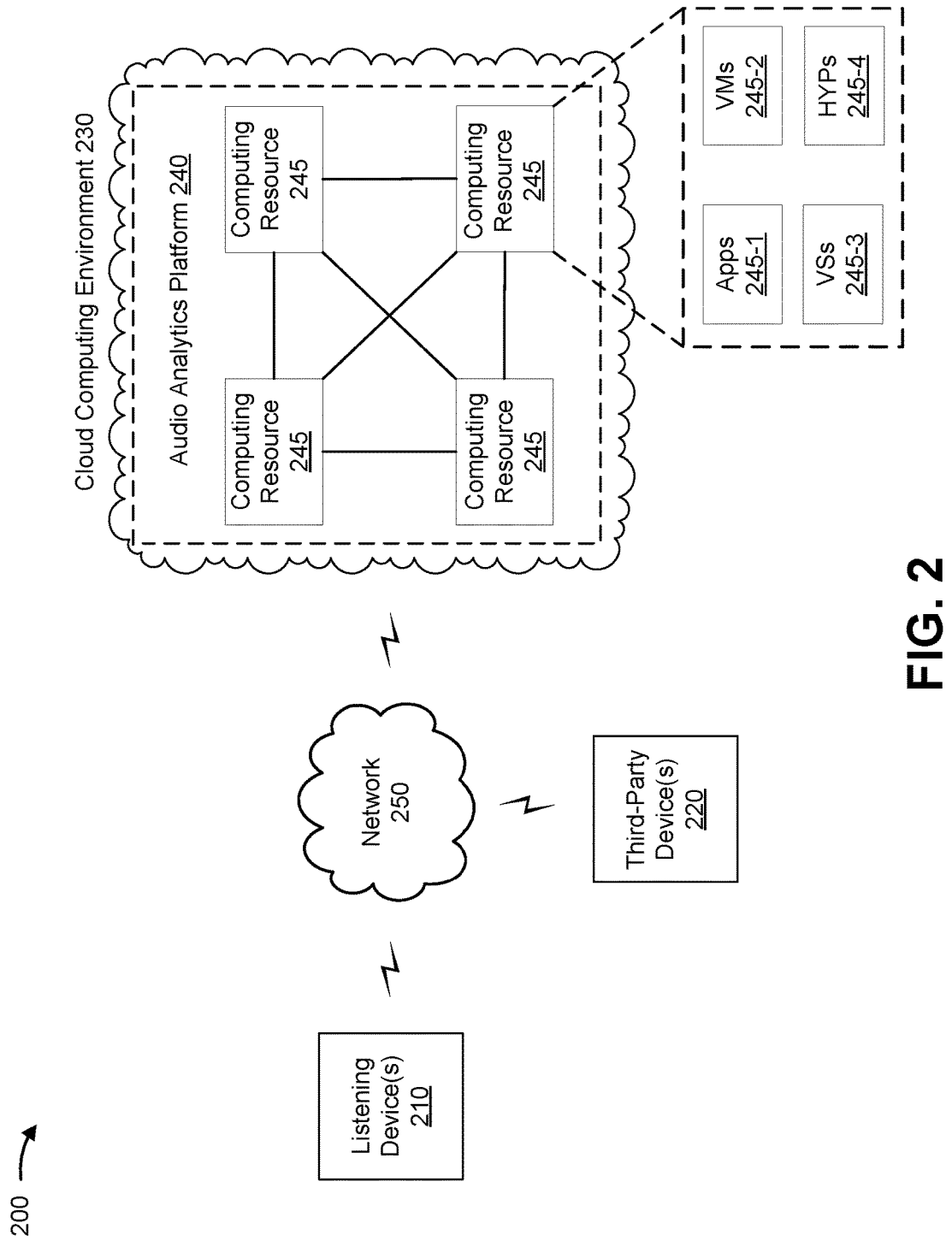
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include at least one listening device 210, at least one third-party device 220, a cloud computing environment 230, an audio analytics platform 240, a computing resource 245, and a network 250. Devices of environment 200 may interconnect via wired connections, wireless connections, or a combination of wired and wireless connections.

Listening device 210 includes one or more one or more devices capable of sending, receiving, generating, storing, processing, communicating, and/or providing audio data, for purposes relating to analyzing the audio data, generating various metrics (e.g., efficiency metrics, cost metrics, consumption metrics, etc.) based on the audio data, and/or performing actions based on the metrics. For example, listening device 210 may include a communication device and/or a computing device, such as a computer, a mobile phone (e.g., a smart phone, a radiotelephone, etc.), a smart device, a smart speaker, a laptop computer, a tablet computer, a handheld computer, a gaming device, a wearable communication device (e.g., a smart wristwatch, a pair of smart eyeglasses, etc.), and/or the like. Listening device 210 may include one or more sensor devices (i.e., local sensor devices) for capturing the audio data and/or be configured to obtain the audio data from one or more remotely disposed sensor devices. The audio data may be captured continuously, or based on a schedule, as desired. The listening device 210 may optionally include a user interface by which a user of the listening device 210 may specify, set, and/or adjust various settings associated with capturing the audio data and/or sending the audio data to audio analytics platform 240.

Third-party device 220 includes one or more one or more devices capable of sending, receiving, generating, storing, processing, communicating, and/or providing third-party data, for purposes relating to analyzing the audio data captured by a listening device (e.g., listening device 210), correlating the audio data to the third-party data to generate various metrics (e.g., efficiency metrics, cost metrics, consumption metrics, etc.), and/or performing actions based on the metrics. For example, third-party device 220 may include a communication device and/or a computing device, such as a server, a computer, a mobile phone (e.g., a smart phone, a radiotelephone, etc.), a laptop computer, a tablet computer, a handheld computer, a gaming device, a wearable communication device (e.g., a smart wristwatch, a pair of smart eyeglasses, etc.), a computing kiosk, a computing terminal, or a similar type of device. Third-party device 220 may be capable of providing a variety of third-party data upon receiving requests for the third-party data from audio analytics platform 240 and/or listening device 210.

For example, third-party device 220 may be associated with a utility company device or server, which may provide cost data, consumption data, efficiency data, and/or the like pertaining to receiving utilities from the utility company (e.g., cost data associated with receiving an amount of natural gas, electricity, water, sewer services, garbage collection services, and/or the like). As another example, third-party device 220 may be associated with a product manufacturer device or server, which may provide cost data, consumption data, efficiency data, and/or the like pertaining to obtaining a product from the product manufacturer (e.g., cost data associated with receiving an amount of paper products, raw materials, commodities, supplies, ingredients, goods, and/or the like). As another example, third-party device 220 may be associated with a fuel company device or server, which may provide cost data, consumption data, efficiency data, and/or the like pertaining to obtaining fuel from the fuel company. As another example, third-party device 220 may be associated with a vehicular device or server, which may provide cost data, consumption data, efficiency data, and/or the like pertaining to the operation, control, and/or management of a vehicle.

Cloud computing environment 230 includes an environment that delivers computing as a service, whereby shared resources, services, etc., may be provided to audio analytics platform 240. Cloud computing environment 230 may provide computation, software, data access, storage, and/or other services that do not require end-user knowledge of a physical location and configuration of a system and/or a device that delivers the services. As shown, cloud computing environment 230 may include audio analytics platform 240 and one or more computing resources 245.

Audio analytics platform 240 includes one or more devices capable of sending, receiving, generating, storing, processing, analyzing, and/or providing information based on audio data. For example, audio analytics platform 240 may include a cloud server or a group of cloud servers configured to obtain and analyze audio data for automated metric derivation. While the example environment 200 indicates that audio analytics platform 240 is implemented in a cloud computing environment 230, in some implementations, audio analytics platform 240 may be implemented by one or more other types of devices as well, such as a server, computer, laptop computer, tablet computer, handheld computer, or the like.

Audio analytics platform 240 is capable of obtaining the audio data from listening device 210 and determining metrics based on the audio data alone, or, in combination with third-party data received from third-party device 220. Audio analytics platform 240 may, in some implementations, include or otherwise have access to other resources to facilitate the intelligent determination of metrics based on the audio data obtained from listening device 210, including resources for generating, training, and/or obtaining models via machine learning, resources for storing historical data, or the like.

Computing resource 245 includes one or more personal computers, workstation computers, server devices, or another type of computation and/or communication device. In some implementations, computing resource 245 may host audio analytics platform 240. The cloud resources may include compute instances executing in computing resource 245, storage devices provided in computing resource 245, data transfer devices provided by computing resource 245, etc. In some implementations, computing resource 245 may communicate with other computing resources 245 via wired connections, wireless connections, or a combination of wired and wireless connections.

As further shown in FIG. 2, computing resource 245 may include a group of cloud resources, such as one or more applications ("APPs") 245-1, one or more virtual machines ("VMs") 245-2, virtualized storage ("VSs") 245-3, one or more hypervisors ("HYPs") 245-4, or the like.

Application 245-1 includes one or more software applications that may be provided to or accessed by listening device 210 and/or third-party device 220. Application 245-1 may eliminate a need to install and execute the software applications on listening device 210 and/or third-party device 220. For example, application 245-1 may include software associated with audio analytics platform 240 and/or any other software capable of being provided via cloud computing environment 230. In some implementations, one application 245-1 may send/receive information to/from one or more other applications 245-1, via virtual machine 245-2.

Virtual machine 245-2 includes a software implementation of a machine (e.g., a computer) that executes programs like a physical machine. Virtual machine 245-2 may be either a system virtual machine or a process virtual machine, depending upon use and degree of correspondence to any real machine by virtual machine 245-2. A system virtual machine may provide a complete system platform that supports execution of a complete operating system ("OS"). A process virtual machine may execute a single program, and may support a single process. In some implementations, virtual machine 245-2 may execute on behalf of a user (e.g., listening device 210 and/or third-party device 220), and may manage infrastructure of cloud computing environment 230, such as data management, synchronization, or long-duration data transfers.

Virtualized storage 245-3 includes one or more storage systems and/or one or more devices that use virtualization techniques within the storage systems or devices of computing resource 245. In some implementations, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

Hypervisor 245-4 provides hardware virtualization techniques that allow multiple operating systems (e.g., "guest operating systems") to execute concurrently on a host computer, such as computing resource 245. Hypervisor 245-4 may present a virtual operating platform to the guest operating systems and may manage the execution of the guest operating systems. Multiple instances of a variety of operating systems may share virtualized hardware resources.

Network 250 includes one or more wired and/or wireless networks. For example, network 250 may include a cellular network (e.g., a long-term evolution (LTE) network, a code division multiple access (CDMA) network, a 3G network, a 4G network, a 5G network, another type of next generation network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
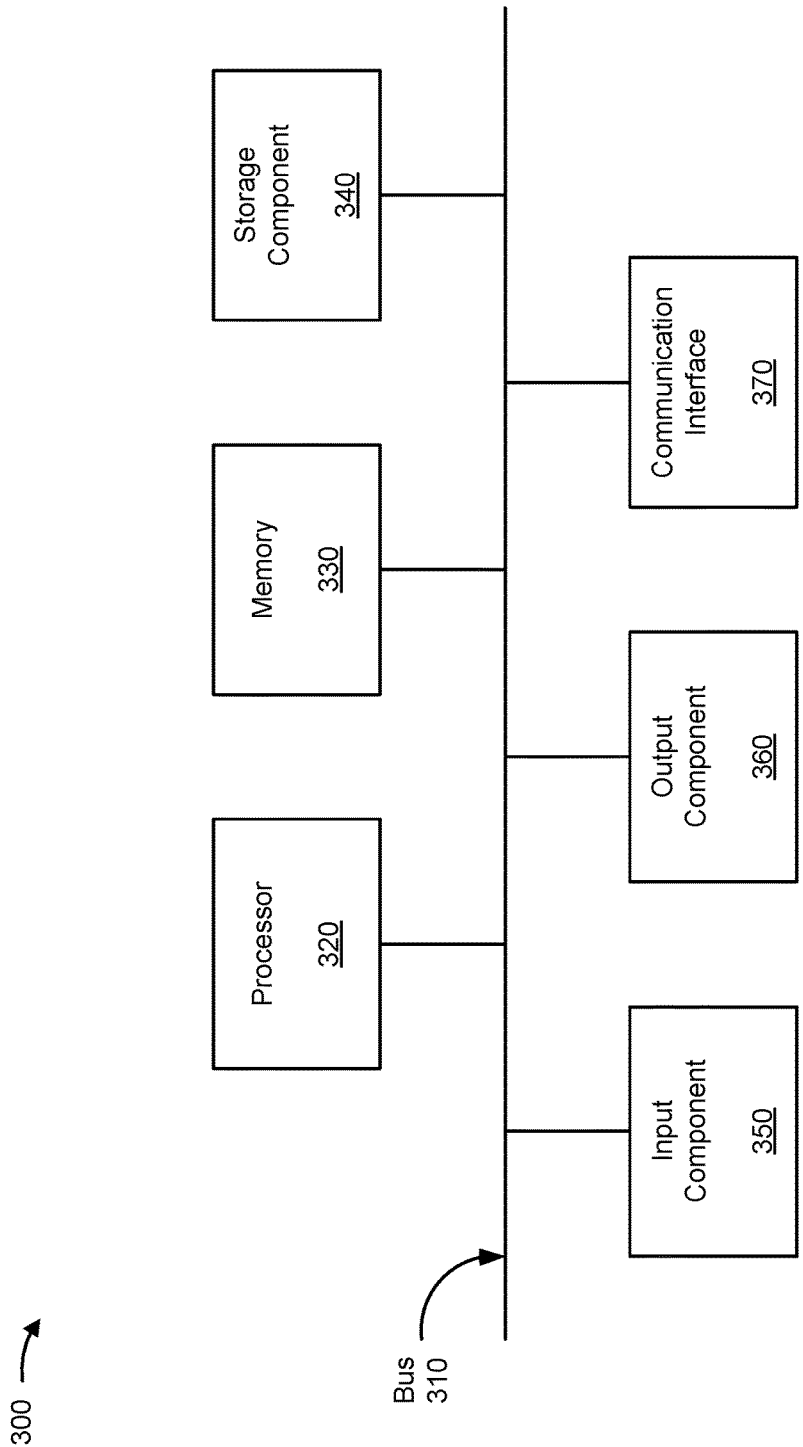
FIG. 3 is a diagram of example components of one or more devices of FIG. 2.

FIG. 3 is a diagram of example components of a device 300. Device 300 may correspond to listening device 210, third-party device 220, audio analytics platform 240, and/or computing resource 245. In some implementations, listening device 210, third-party device 220, audio analytics platform 240, and/or computing resource 245 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
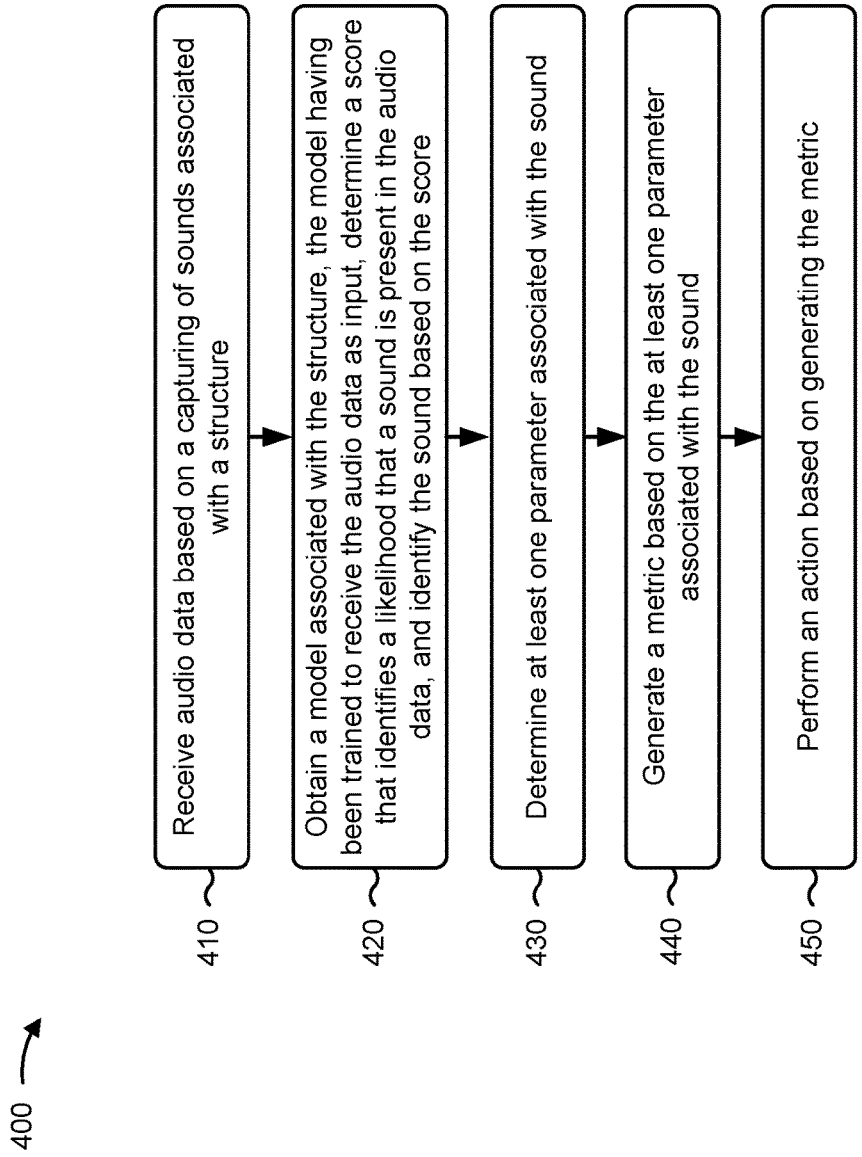
FIG. 4 is a flow chart of an example process for obtaining metrics based on a capturing of sounds.

FIG. 4 is a flow chart of an example process 400 for obtaining metrics based on a capturing of sounds. In some implementations, one or more process blocks of FIG. 4 may be performed by an audio analytics platform (e.g., audio analytics platform 240). In some implementations, one or more process blocks of FIG. 4 may be performed by another device or a group of devices separate from or including audio analytics platform (e.g., audio analytics platform 240), such as a listening device (e.g., listening device 210) or a third-party device (e.g., third-party device 220).

As shown in FIG. 4, process 400 may include receiving audio data based on a capturing of sounds associated with a structure (block 410). For example, audio analytics platform (e.g., audio analytics platform 240, using computing resource 245, processor 320, memory 330, storage component 340, input component 350, communication interface 370, and/or the like) may receive audio data based on a capturing of sounds associated with a structure, as described above in connection with FIGS. 1A-1D.

As further shown in FIG. 4, process 400 may include obtaining a model associated with the structure, the model having been trained to receive the audio data as input, determine a score that identifies a likelihood that a sound is present in the audio data, and identify the sound based on the score (block 420). For example, audio analytics platform (e.g., audio analytics platform 240, using computing resource 245, processor 320, memory 330, storage component 340, input component 350, communication interface 370, and/or the like) may obtain a model associated with the structure, as described above in connection with FIGS. 1A-1D. In some implementations, the model has been trained to receive the audio data as input, determine a score that identifies a likelihood that a sound is present in the audio data, and identify the sound based on the score.

As further shown in FIG. 4, process 400 may include determining at least one parameter associated with the sound (block 430). For example, audio analytics platform (e.g., audio analytics platform 240, using computing resource 245, processor 320, memory 330, storage component 340, communication interface 370, and/or the like) may determine at least one parameter associated with the sound, as described above in connection with FIGS. 1A-1D.

As further shown in FIG. 4, process 400 may include generating a metric based on the at least one parameter associated with the sound (block 440). For example, audio analytics platform (e.g., audio analytics platform 240, using computing resource 245, processor 320, memory 330, storage component 340, communication interface 370, and/or the like) may generate a metric based on the at least one parameter associated with the sound, as described above in connection with FIGS. 1A-1D.

As further shown in FIG. 4, process 400 may include performing an action based on generating the metric (block 450). For example, audio analytics platform (e.g., audio analytics platform 240, using computing resource 245, processor 320, memory 330, storage component 340, output component 360, communication interface 370, and/or the like) may perform an action based on generating the metric, as described above in connection with FIGS. 1A-1D.

Process 400 may include additional implementations, such as any single implementation or any combination of implementations described below and/or in connection with one or more other processes described elsewhere herein.

In some implementations, the capturing of sounds includes a capturing of ambient noises. In some implementations, the at least one parameter includes an amount of time associated with an occurrence of the sound, generating the metric includes determining an aggregated amount of time associated with a plurality of occurrences of the sound during a specified time period. In some implementations, the at least one parameter includes a count associated with an occurrence of the sound, and generating the metric includes increasing the count for each additional occurrence of the sound during a specified time period.

In some implementations, the action performed by the audio analytics platform includes obtaining third-party data from a third-party device. The third-party data may include cost data associated with obtaining a quantity of a consumable good, cost data associated with obtaining a gallon of water, or cost data associated with obtaining a kilowatt hour of electrical power. In some implementations, the audio analytics platform may determine a cost of consumption based on a correlation of the metric and the third-party data. In some implementations, the action performed by the audio analytics platform includes generating an instruction, and sending the instruction to a user equipment to cause the user equipment to power on or power off based on the instruction. In some implementations, the action performed by the audio analytics platform includes publishing the metric for use by a third-party device.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
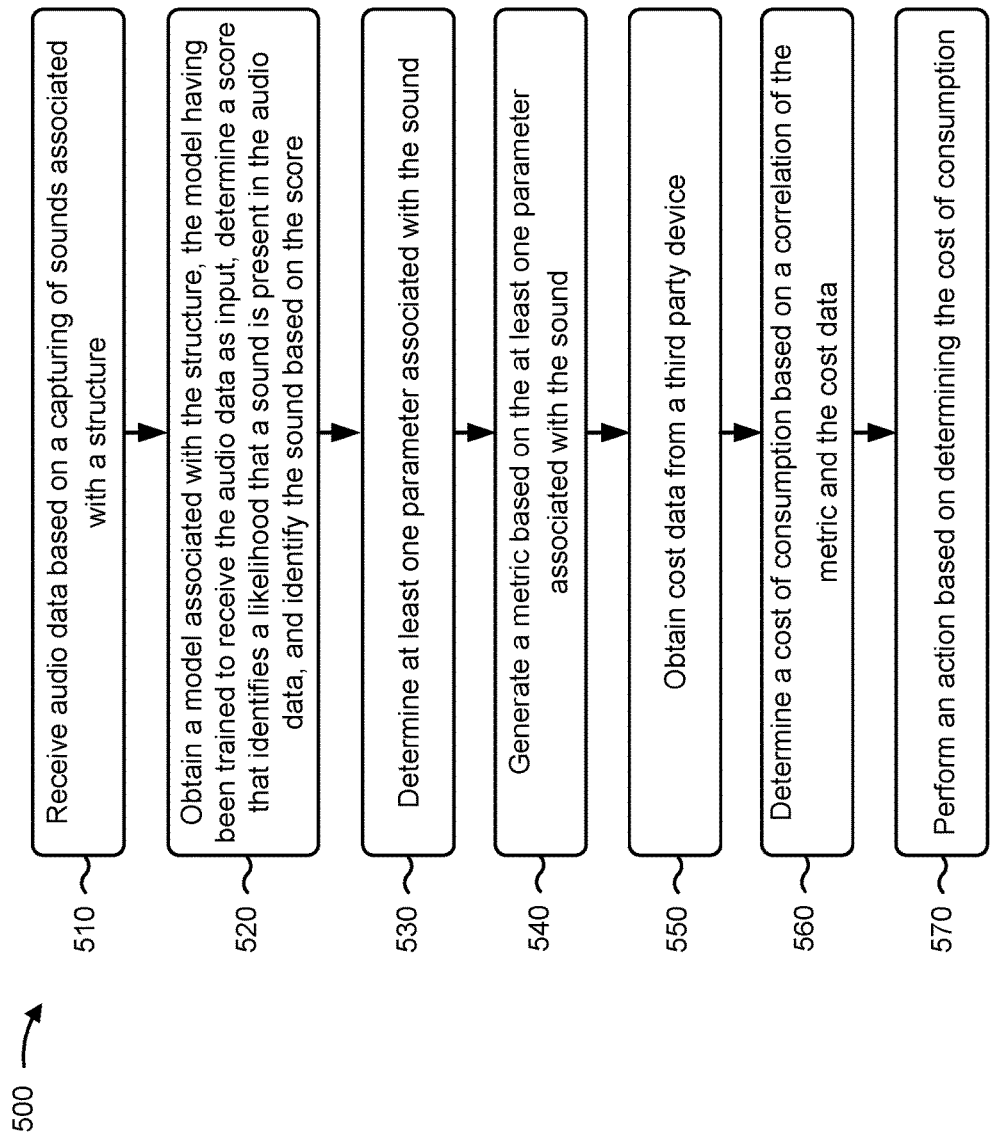
FIG. 5 is a flow chart of an example process for obtaining metrics based on a capturing of sounds.

FIG. 5 is a flow chart of an example process 500 for obtaining metrics based on a capturing of sounds. In some implementations, one or more process blocks of FIG. 5 may be performed by an audio analytics platform (e.g., audio analytics platform 240). In some implementations, one or more process blocks of FIG. 5 may be performed by another device or a group of devices separate from or including audio analytics platform (e.g. audio analytics platform 240), such as a listening device (e.g., listening device 210), or a third-party device (e.g., third-party device 220).

As shown in FIG. 5, process 500 may include receiving audio data based on a capturing of sounds associated with a structure (block 510). For example, audio analytics platform (e.g., audio analytics platform 240, using computing resource 245, processor 320, memory 330, storage component 340, input component 350, communication interface 370, and/or the like) may receive audio data based on a capturing of sounds associated with a structure, as described above in connection with FIGS. 1A-1D.

As further shown in FIG. 5, process 500 may include obtaining a model associated with the structure, the model having been trained to receive the audio data as input, determine a score that identifies a likelihood that a sound is present in the audio data, and identify the sound based on the score (block 520). For example, audio analytics platform (e.g., audio analytics platform 240, using computing resource 245, processor 320, memory 330, storage component 340, input component 350, communication interface 370, and/or the like) may obtain a model associated with the structure, as described above in connection with FIGS. 1A-1D. In some implementations, the model has been trained to receive the audio data as input, determine a score that identifies a likelihood that a sound is present in the audio data, and identify the sound based on the score.

As further shown in FIG. 5, process 500 may include determining at least one parameter associated with the sound (block 530). For example, audio analytics platform (e.g., audio analytics platform 240, using computing resource 245, processor 320, memory 330, storage component 340, communication interface 370, and/or the like) may determine at least one parameter associated with the sound, as described above in connection with FIGS. 1A-1D.

As further shown in FIG. 5, process 500 may include generating a metric based on the at least one parameter associated with the sound (block 540). For example, audio analytics platform (e.g., audio analytics platform 240, using computing resource 245, processor 320, memory 330, storage component 340, communication interface 370, and/or the like) may generate a metric based on the at least one parameter associated with the sound, as described above in connection with FIGS. 1A-1D.

As further shown in FIG. 5, process 500 may include obtaining cost data from a third-party device (block 550). For example, audio analytics platform (e.g., audio analytics platform 240, using computing resource 245, processor 320, memory 330, storage component 340, input component 350, communication interface 370, and/or the like) may obtain cost data from a third-party device, as described above in connection with FIGS. 1A-1D.

As further shown in FIG. 5, process 500 may include determining a cost of consumption based on a correlation of the metric and the cost data (block 560). For example, audio analytics platform (e.g., audio analytics platform 240, using computing resource 245, processor 320, memory 330, storage component 340, communication interface 370, and/or the like) may determine a cost of consumption based on a correlation of the metric and the cost data, as described above in connection with FIGS. 1A-1D.

As further shown in FIG. 5, process 500 may include performing an action based on determining the cost of consumption (block 570). For example, audio analytics platform (e.g., audio analytics platform 240, using computing resource 245, processor 320, memory 330, storage component 340, output component 360, communication interface 370, and/or the like) may perform an action based on determining the cost of consumption, as described above in connection with FIGS. 1A-1D.

Process 500 may include additional implementations, such as any single implementation or any combination of implementations described below and/or in connection with one or more other processes described elsewhere herein.

In some implementations, the audio analytics platform may identify the sound from ambient noise. In some implementations, the structure may include a building, a space formed by the building, a vehicle, or a space formed by the vehicle. In some implementations, the cost of consumption includes a cost of consuming an amount of water during a specified time period, a cost of consuming an amount of consumable goods during the specified time period, a cost of consuming an amount of electrical power during the specified time period, a cost of consuming an amount of conditioned air during the specified time period, a cost of obtaining a cubic foot of natural gas, or a cost of consuming an amount of natural gas.

In some implementations, the action performed by the audio analytics platform includes instructing a user equipment associated with the structure to power on, power off, increase power consumption, or adjust a setting, publishing the metric, publishing the cost of consumption, or publishing the metric and the cost of consumption for use by a querying device, or transmitting a notification to a user device associated with a user of the structure, the notification including the metric, the cost of consumption, or the metric and the cost of consumption. In some implementations, the at least one parameter includes a temporal frequency, a duration, or a decibel level associated with the sound. In some implementations, a microphone captures the sounds associated with the structure.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
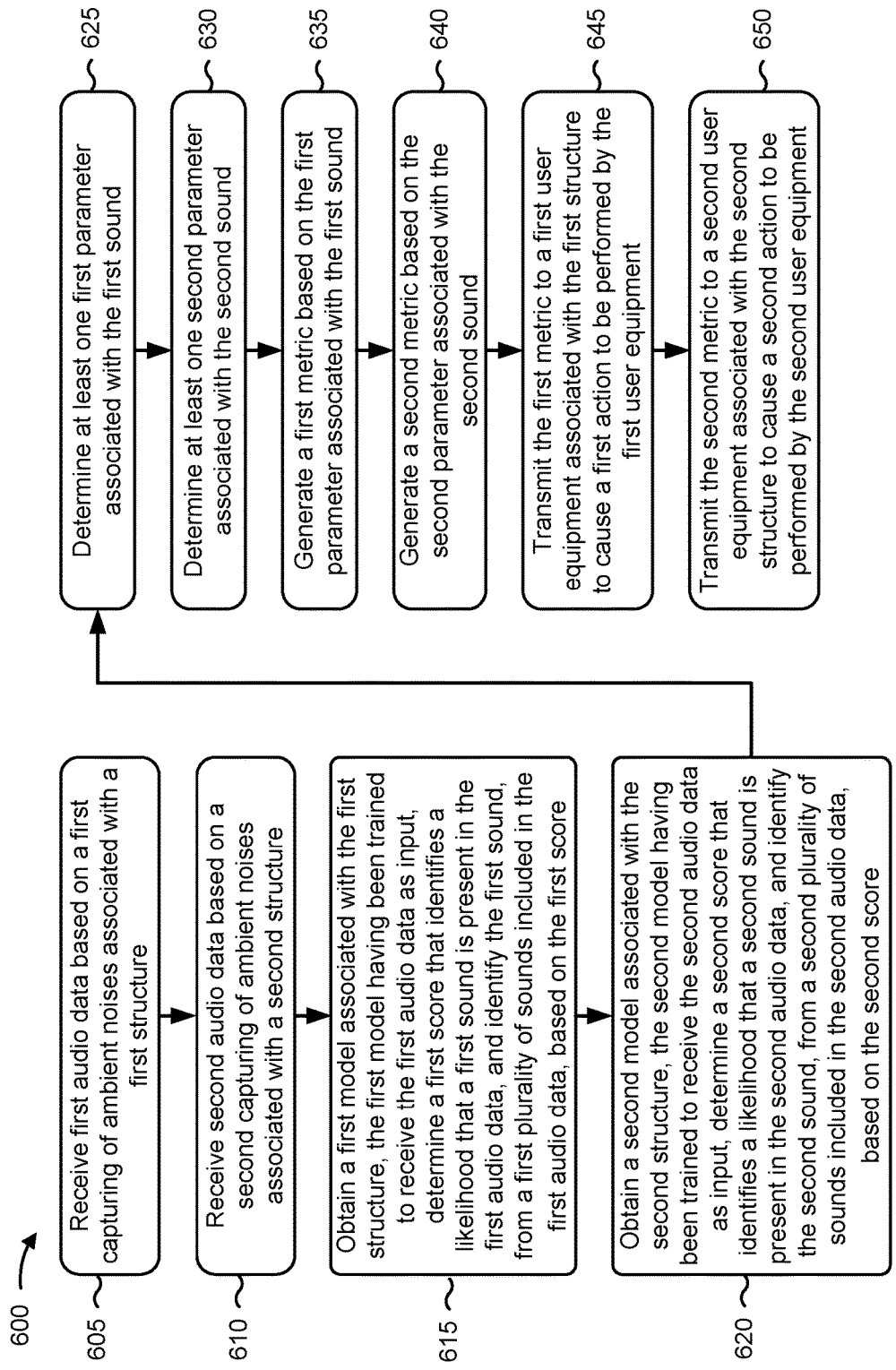
FIG. 6 is a flow chart of an example process for obtaining metrics based on a capturing of sounds.

FIG. 6 is a flow chart of an example process 600 for obtaining metrics based on a capturing of sounds. In some implementations, one or more process blocks of FIG. 6 may be performed by an audio analytics platform (e.g., audio analytics platform 240). In some implementations, one or more process blocks of FIG. 6 may be performed by another device or a group of devices separate from or including audio analytics platform (e.g., audio analytics platform 240), such as a listening device (e.g., listening device 210), or a third-party device (e.g., third-party device 220).

As shown in FIG. 6, process 600 may include receiving first audio data based on a first capturing of ambient noises associated with a first structure (block 605). For example, audio analytics platform (e.g., audio analytics platform 240, using computing resource 245, processor 320, memory 330, storage component 340, input component 350, communication interface 370, and/or the like) may receive first audio data based on a first capturing of ambient noises associated with a first structure, as described above in connection with FIGS. 1A-1D.

As shown in FIG. 6, process 600 may include receiving second audio data based on a second capturing of ambient noises associated with a second structure (block 610). For example, audio analytics platform (e.g., audio analytics platform 240, using computing resource 245, processor 320, memory 330, storage component 340, input component 350, communication interface 370, and/or the like) may receive second audio data based on a second capturing of ambient noises associated with a second structure, as described above in connection with FIGS. 1A-1D.

As further shown in FIG. 6, process 600 may include obtaining a first model associated with the first structure, the first model having been trained to receive the first audio data as input, determine a first score that identifies a likelihood that a first sound is present in the first audio data, and identify the first sound, from a first plurality of sounds included in the first audio data, based on the first score (block 615). For example, audio analytics platform (e.g., audio analytics platform 240, using computing resource 245, processor 320, memory 330, storage component 340, input component 350, communication interface 370, and/or the like) may obtain a first model associated with the first structure, as described above in connection with FIGS. 1A-1D. In some implementations, the model has been trained to receive the first audio data as input, determine a first score that identifies a likelihood that a first sound is present in the first audio data, and identify the first sound, from a first plurality of sounds included in the first audio data, based on the first score.

As further shown in FIG. 6, process 600 may include obtaining a second model associated with the second structure, the second model having been trained to receive the second audio data as input, determine a second score that identifies a likelihood that a second sound is present in the second audio data, and identify the second sound, from a second plurality of sounds included in the second audio data, based on the second score (block 620). For example, audio analytics platform (e.g., audio analytics platform 240, using computing resource 245, processor 320, memory 330, storage component 340, input component 350, communication interface 370, and/or the like) may obtain a second model associated with the second structure, as described above in connection with FIGS. 1A-1D. In some implementations, second model has been trained to receive the second audio data as input, determine a second score that identifies a likelihood that a second sound is present in the second audio data, and identify the second sound, from a second plurality of sounds included in the second audio data, based on the second score.

As further shown in FIG. 6, process 600 may include determining at least one first parameter associated with the first sound (block 625). For example, audio analytics platform (e.g., audio analytics platform 240, using computing resource 245, processor 320, memory 330, storage component 340, communication interface 370, and/or the like) may determine at least one first parameter associated with the first sound, as described above in connection with FIGS. 1A-1D.

As further shown in FIG. 6, process 600 may include determining at least one second parameter associated with the second sound (block 630). For example, audio analytics platform (e.g., audio analytics platform 240, using computing resource 245, processor 320, memory 330, storage component 340, communication interface 370, and/or the like) may determine at least one second parameter associated with the second sound, as described above in connection with FIGS. 1A-1D.

As further shown in FIG. 6, process 600 may include generating a first metric based on the first parameter associated with the first sound (block 635). For example, audio analytics platform (e.g., audio analytics platform 240, using computing resource 245, processor 320, memory 330, storage component 340, communication interface 370, and/or the like) may generate a first metric based on the first parameter associated with the first sound, as described above in connection with FIGS. 1A-1D.

As further shown in FIG. 6, process 600 may include generating a second metric based on the second parameter associated with the second sound (block 640). For example, audio analytics platform (e.g., audio analytics platform 240, using computing resource 245, processor 320, memory 330, storage component 340, communication interface 370, and/or the like) may generate a second metric based on the second parameter associated with the second sound, as described above in connection with FIGS. 1A-1D.

As further shown in FIG. 6, process 600 may include transmitting the first metric to a first user equipment associated with the first structure to cause an action to be performed by the first user equipment (block 645). For example, audio analytics platform (e.g., audio analytics platform 240, using computing resource 245, processor 320, memory 330, storage component 340, output component 360, communication interface 370, and/or the like) may transmit the first metric to a first user equipment associated with the first structure to cause an action to be performed by the first user equipment, as described above in connection with FIGS. 1A-1D.

As further shown in FIG. 6, process 600 may include transmitting the second metric to a second user equipment associated with the second structure to cause an action to be performed by the second user equipment (block 650). For example, audio analytics platform (e.g., audio analytics platform 240, using computing resource 245, processor 320, memory 330, storage component 340, output component 360, communication interface 370, and/or the like) may transmit the second metric to a second user equipment associated with the second structure to cause an action to be performed by the second user equipment, as described above in connection with FIGS. 1A-1D.

Process 600 may include additional implementations, such as any single implementation or any combination of implementations described below and/or in connection with one or more other processes described elsewhere herein.

In some implementations, the audio analytics platform may obtain cost data from a third-party device, determine a first cost of consumption associated with the first structure based on a correlation of the first metric and the cost data, and determine a second cost of consumption associated with the second structure based on a correlation of the second metric and the cost data. In some implementations, the audio analytics platform may publish the first cost of consumption for use by a querying device, and publish the second cost of consumption for use by the querying device.

In some implementations, the audio analytics platform may identify the first sound from the first plurality of sounds based on the first score including a first measure of confidence that satisfies a first threshold, and identify the second sound from the second plurality of sounds based on the second score including a second measure of confidence that satisfies a second threshold. In some implementations, the audio analytics platform may publish the first metric for use by a third-party device, and publish the second metric for use by the third-party device.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, resources that would otherwise be devoted to manually determining metrics associated with energy usage, consumption, and/or efficiency for a structure may be reduced or obviated. By implementing actions based on metrics associated with passively captured sounds, energy losses and/or waste may be controlled and/or minimized. The listening devices and/or audio analytics platform described herein may capture, receive, and/or analyze thousands, millions, billions, etc., instances of audio data, the volume of which cannot be processed objectively by human actors.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Certain user interfaces have been described herein and/or shown in the figures. A user interface may include a graphical user interface, a non-graphical user interface, a text-based user interface, or the like. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Additionally, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Additionally, as used herein, the terms "has," "have," "having," or the like are intended to be open-ended terms. Further, the phrase "based on" is intended to refer to "based, at least in part, on" unless explicitly stated otherwise.

What is claimed is:

1. A method, comprising:
    receiving, by a device, audio data based on sounds associated with a structure;
    obtaining, by the device, a model associated with the structure,
        the model having been trained to:
            receive the audio data as input, and
            identify a sound as output;
    identifying, by the device and based on the model, the sound;
    determining, by the device, at least one parameter associated with the sound;
    generating, by the device, a first metric based on the at least one parameter,
        the first metric indicating usage of an equipment associated with the structure;
    obtaining, by the device, at least one second metric associated with the equipment,
        the at least one second metric indicating usage of other equipment associated with at least one other structure; and
    performing, by the device, an action based on the first metric and the at least one second metric.

2. The method of claim 1, wherein the structure is one of:
    a building, or
    a vehicle.

3. The method of claim 1, wherein receiving the audio data comprises:
    receiving the audio data from a plurality of audio devices associated with the structure.

4. The method of claim 1, wherein determining the at least one parameter associated with the sound comprises:
    determining the at least one parameter based on a predefined association between the sound and the at least one parameter.

5. The method of claim 1, wherein the at least one parameter is based on a user configuration that defines, for the sound, one or more parameters of the at least one parameter,
    the user configuration having been previously defined by a user associated with the structure.

6. The method of claim 1, further comprising:
    receiving training data based on second sounds associated with the structure; and
    training the model based on the training data.

7. The method of claim 1, further comprising:
    receiving training data based on second sounds associated with another structure; and
    training the model based on the training data.

8. A device comprising:
    one or more memories; and
    one or more processors, communicatively coupled to the one or more memories, configured to:

receive audio data based on sounds associated with a structure;
identify a particular sound included in the audio data;
identify, based on the particular sound, an equipment associated with the structure;
determine, based on the particular sound and the equipment, a parameter associated with the equipment,
the parameter indicating that the equipment is in use;
generate a first metric based on the parameter,
the first metric indicating at least one of:
a period of time the equipment is in use, or
a quantity of uses of the equipment;
obtain, from a second device, a second metric associated with the equipment,
the second metric indicating usage of other equipment associated with at least one other structure; and
perform an action based on the first metric and the second metric.

9. The device of claim 8, wherein the one or more processors, when identifying the particular sound included in the audio data, are to:
identify the particular sound using a model trained to identify the particular sound.

10. The device of claim 9, wherein the one or more processors are further to:
obtain usage data associated with the equipment,
the usage data including sounds associated with the equipment and data indicating when the equipment is in use; and
train the model based on the usage data.

11. The device of claim 8, wherein the second metric indicates an operating cost associated with the usage of the other equipment.

12. The device of claim 8, wherein the one or more processors, when identifying the equipment associated with the structure, are to:
identify the equipment based on previously stored data that correlates the particular sound with the equipment.

13. The device of claim 8, wherein the one or more processors, when performing the action based on the first metric and the second metric, are to:
determine cost data indicating a cost associated with the usage of the equipment; and
provide the cost data to a user device associated with the structure.

14. The device of claim 8, wherein the one or more processors, when performing the action based on the first metric and the second metric, are to:
determine cost data indicating a cost associated with the usage of the equipment; and
provide, based on the cost data, another device with data that causes a change in configuration to occur for the equipment.

15. A non-transitory computer-readable medium storing instructions, the instructions comprising:
one or more instructions that, when executed by one or more processors, cause the one or more processors to:
receive audio data associated with a structure;
identify, based on the audio data and a model, an equipment associated with the structure,
the model having been trained to:
receive the audio data as input, and
identify the equipment as output;
determine, based on the audio data and the equipment, a parameter associated with the equipment,
the parameter indicating that the equipment is in use;
generate a first metric based on the parameter,
the first metric indicating at least one of:
a period of time the equipment is in use, or
a quantity of uses of the equipment;
obtain a second metric associated with the equipment,
the second metric indicating usage of other equipment associated with at least one other structure; and
perform an action based on the first metric and the second metric.

16. The non-transitory computer-readable medium of claim 15, wherein the audio data includes ambient sound associated with the structure.

17. The non-transitory computer-readable medium of claim 15, wherein the one or more instructions, that cause the one or more processors to obtain the second metric, further cause the one or more processors to:
provide, to a device, a request for the second metric,
the request identifying the equipment; and
receive, based on the request, the second metric.

18. The non-transitory computer-readable medium of claim 15, wherein the one or more instructions further cause the one or more processors to:
obtain usage data associated with the equipment,
the usage data including sounds associated with the equipment and data indicating when the equipment is in use; and
train the model based on the usage data.

19. The non-transitory computer-readable medium of claim 15, wherein the second metric indicates an operating cost associated with the usage of the other equipment.

20. The non-transitory computer-readable medium of claim 15, wherein the one or more instructions, that cause the one or more processors to perform the action, further cause the one or more processors to:
determine an operating cost associated with the audio data; and
provide, to a user device, data indicating the operating cost.

* * * * *